United States Patent [19]

Smith

[11] Patent Number: 5,438,294
[45] Date of Patent: Aug. 1, 1995

[54] GATE DRIVE CIRCUIT

[75] Inventor: David A. Smith, Kowloon, Hong Kong

[73] Assignee: Astec International, Ltd., Hong Kong

[21] Appl. No.: 32,791

[22] Filed: Mar. 17, 1993

[30] Foreign Application Priority Data

Mar. 19, 1992 [GB] United Kingdom ............... 9206012

[51] Int. Cl.⁶ .......................................... H03K 17/16
[52] U.S. Cl. .................................... 327/384; 327/310; 327/304
[58] Field of Search ............... 307/261, 264, 268, 491, 307/542.1, 572, 573; 328/113, 123

[56] References Cited

U.S. PATENT DOCUMENTS

| | | | |
|---|---|---|---|
| 3,571,624 | 3/1971 | Leung | 307/300 |
| 4,177,393 | 12/1979 | Förster | 307/300 |
| 4,178,521 | 12/1979 | Speth | 307/300 |
| 4,200,813 | 4/1980 | Van Schaik et al. | 307/300 |
| 4,342,956 | 8/1982 | Archer | 307/300 |
| 4,481,431 | 11/1984 | Nishino et al. | 307/300 |
| 4,937,726 | 6/1990 | Reustle | 363/56 |

OTHER PUBLICATIONS

Astec Semiconductor, Technical Data Sheet for the "AS3842/3/4/5 Current Mode PWM Controller," Sep. 1990.

Primary Examiner—Steven L. Stephan
Assistant Examiner—Shawn Riley
Attorney, Agent, or Firm—Coudert Brothers

[57] ABSTRACT

An improved gate drive circuit for use with a switching power device in a power converter and other power-transfer type circuits and the like is described. The gate drive circuit according to the present invention requires fewer components and space that convention prior art gate drive circuits. The drive circuit provides isolation between the control circuitry and the device without storing a significant amount of long-term (i.e., D.C.) energy and is also more energy efficient than many prior art gate drive circuits. Additionally, the present invention comprises means for cleanly terminating the drive signal to the switching power device when the control circuitry terminates operation. This prevents an incorrect signal to the switching power device, which may conduct at an inappropriate time, causing damage to the power converter or power-transfer circuit. Many prior art drive circuits have D.C. blocking capacitors that discharge slowly upon termination and, consequently, cause the switching power device to inadvertently conduct, which may damage the converter.

20 Claims, 5 Drawing Sheets

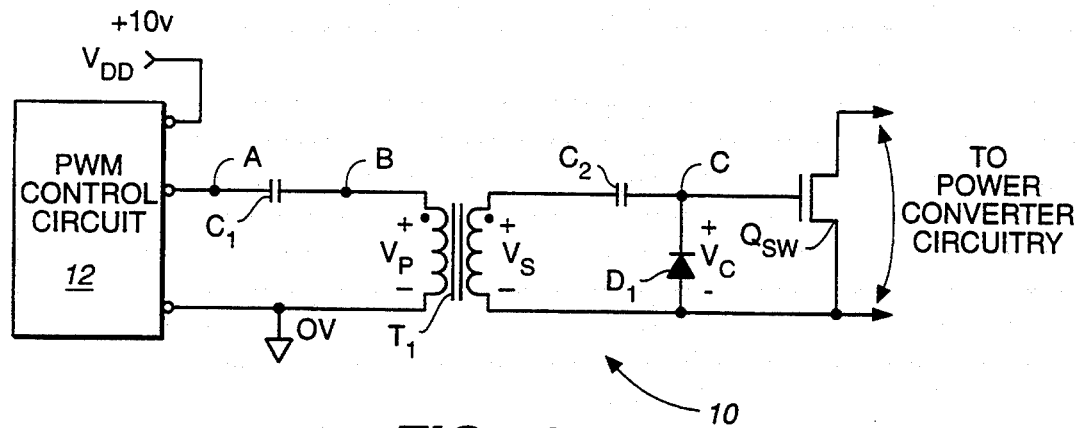
FIG._1
(PRIOR ART)
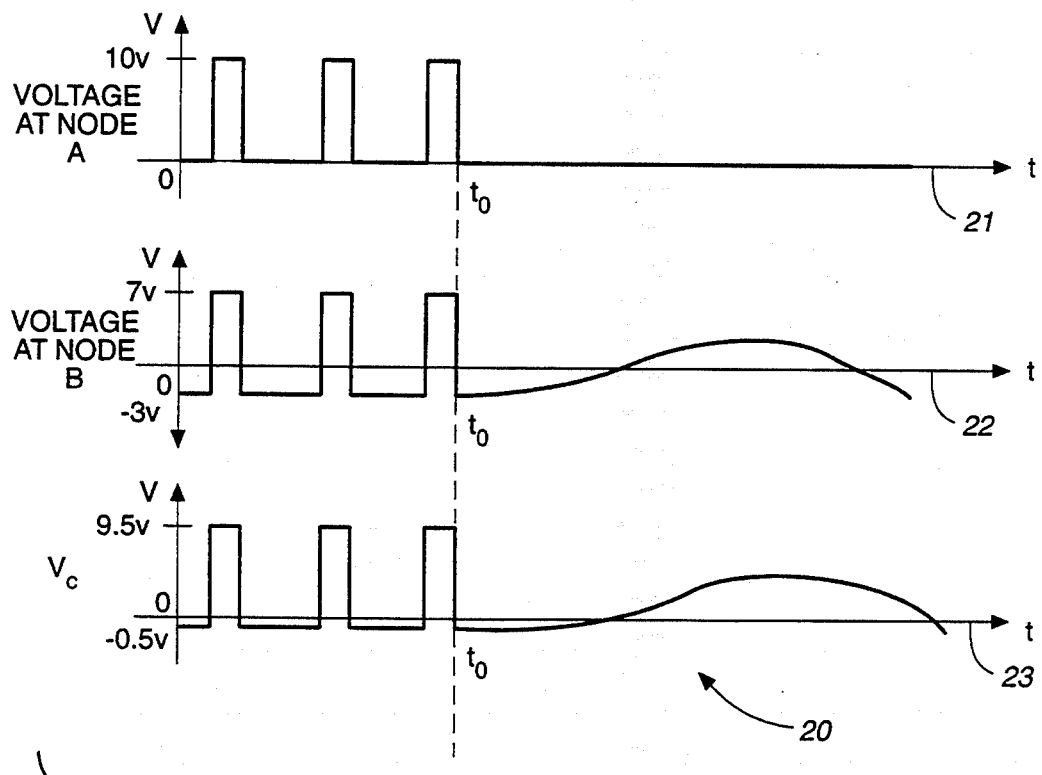
FIG._2
(PRIOR ART)

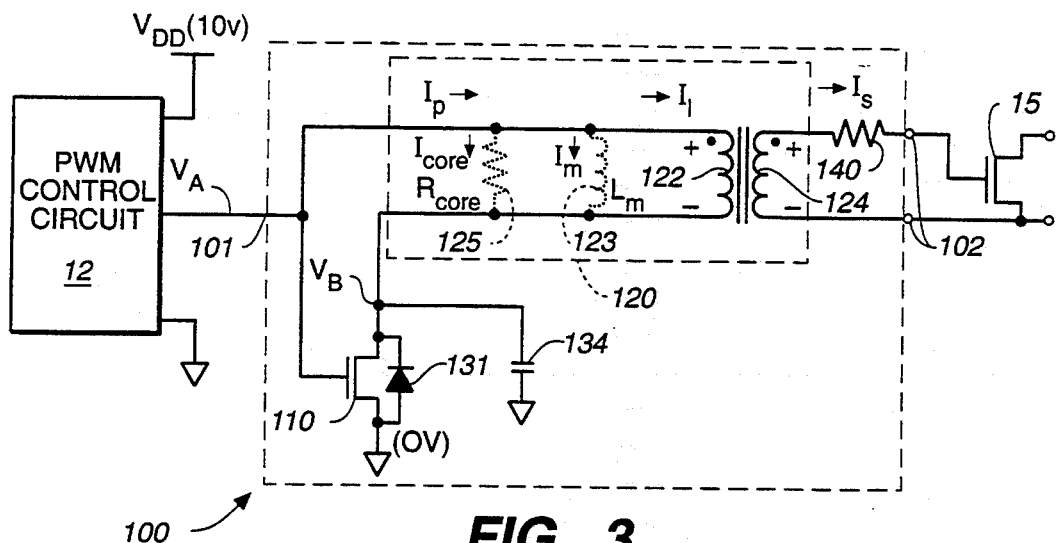
FIG._3
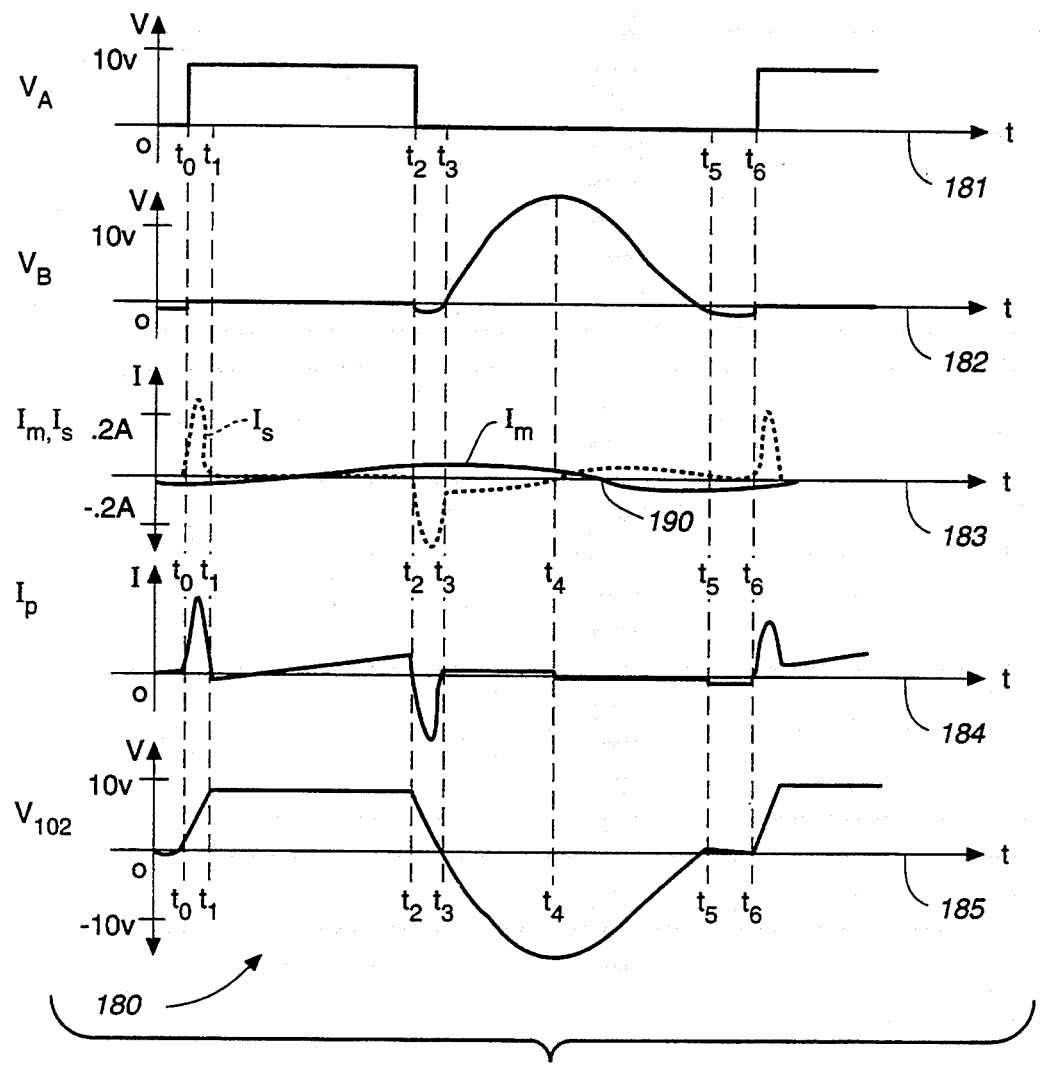
FIG._4

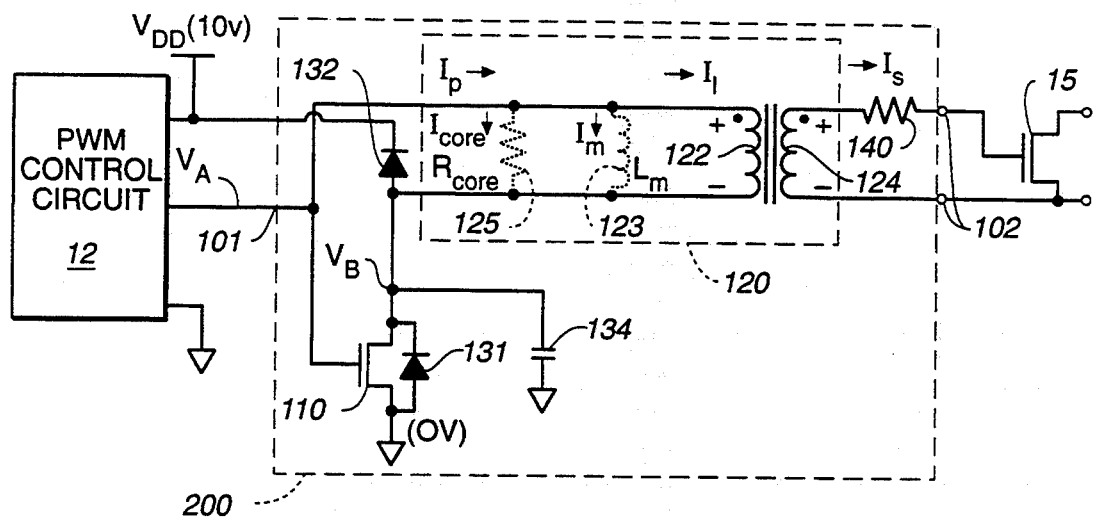
FIG._5
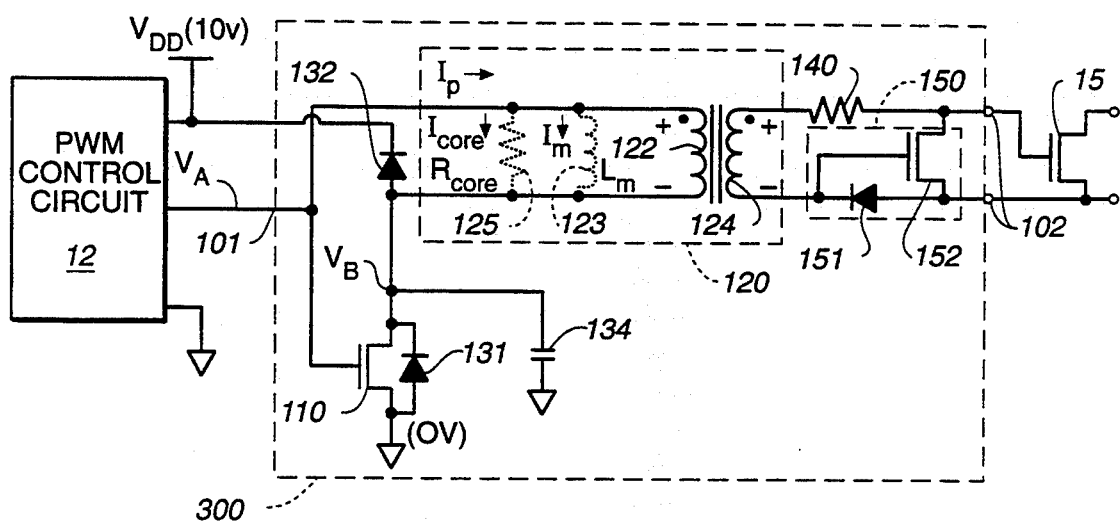
FIG._6

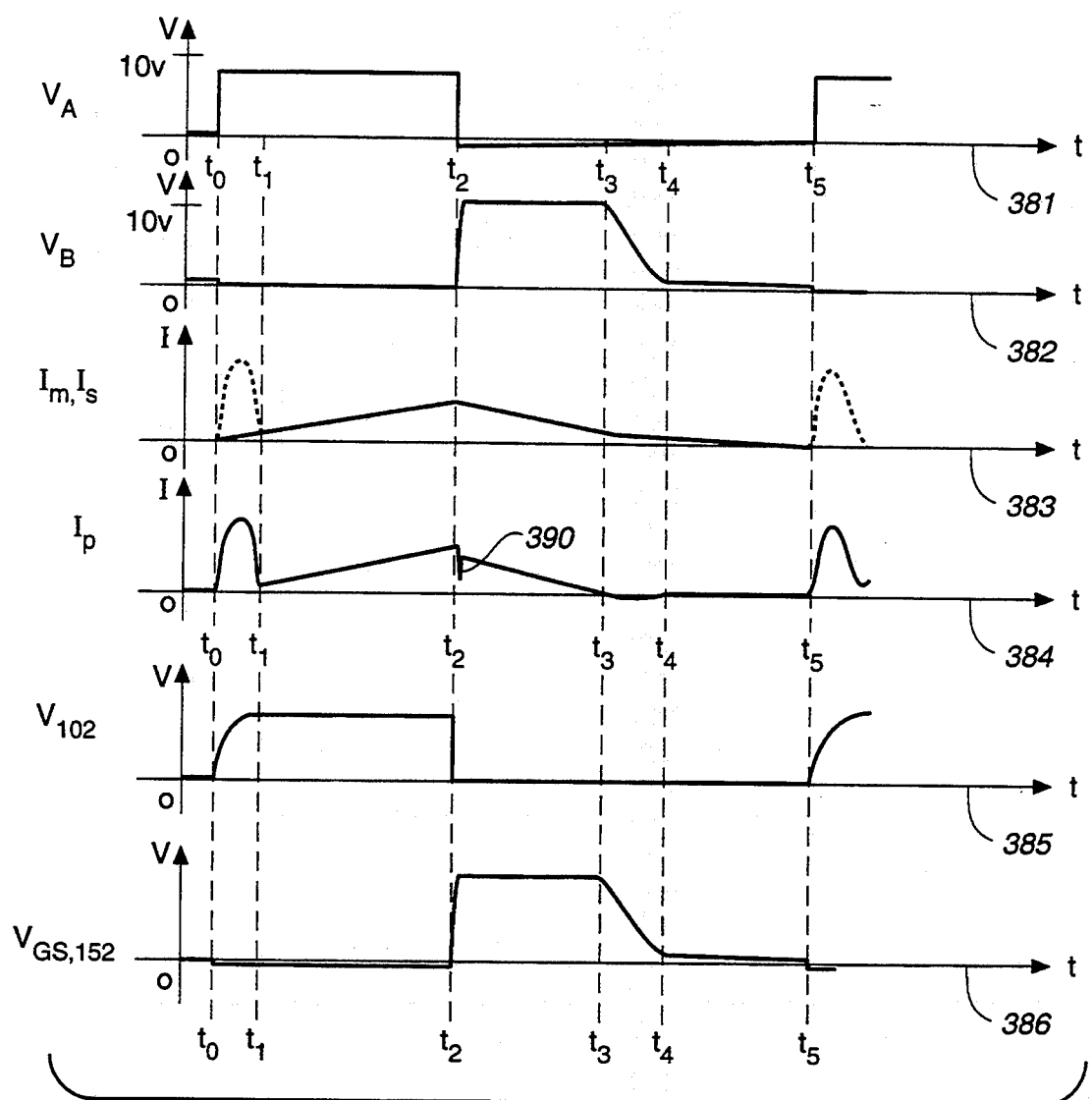
FIG._7
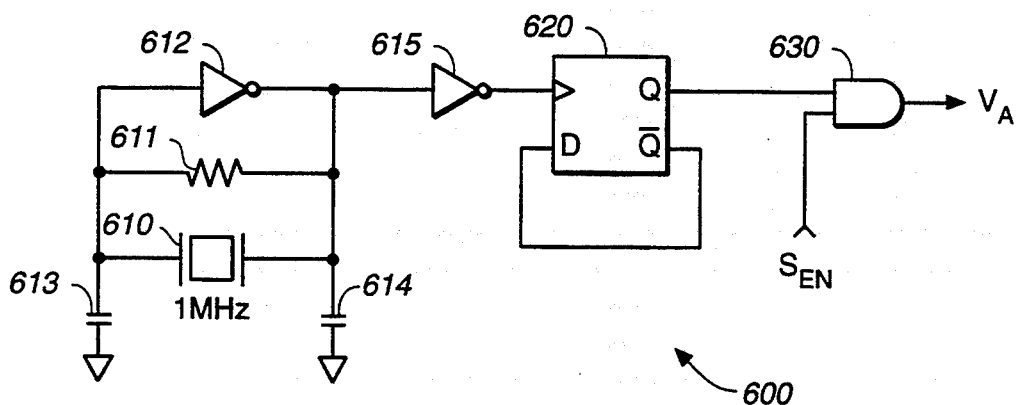
FIG._10

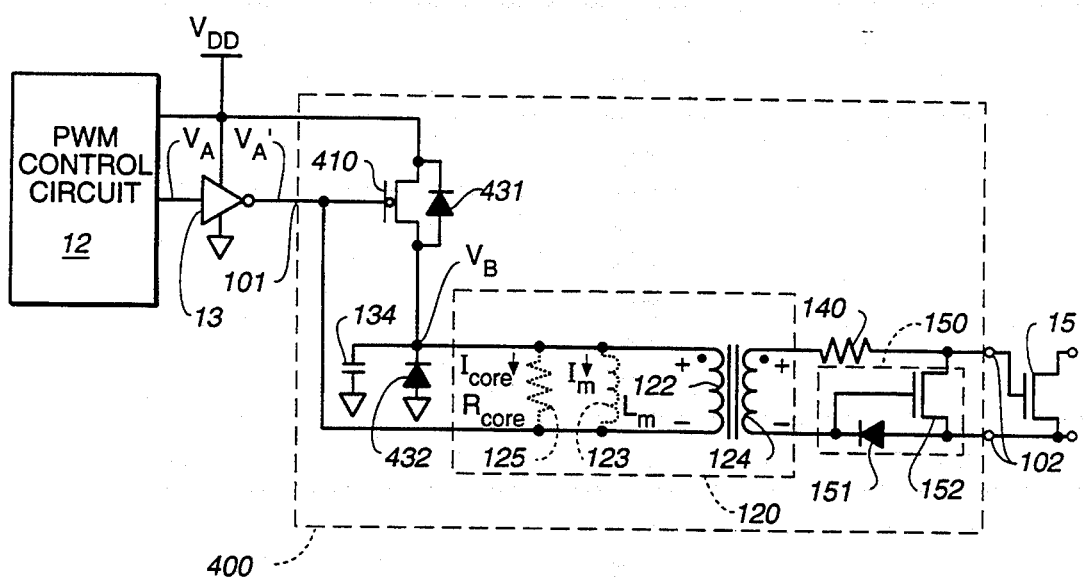
FIG._8
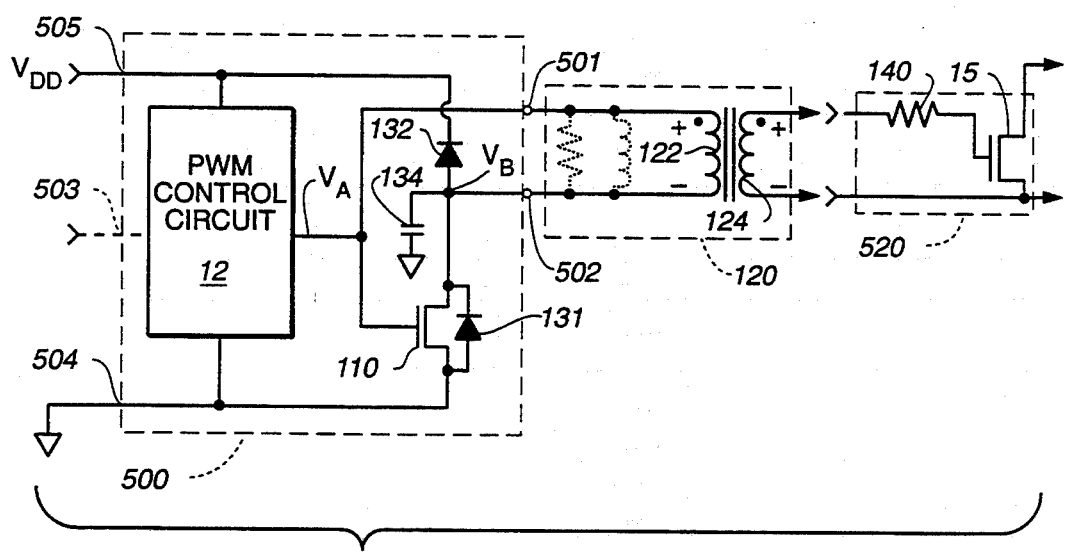
FIG._9A
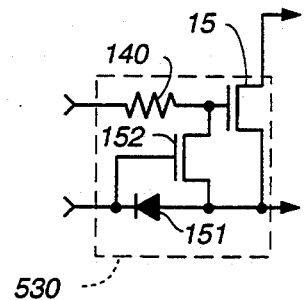
FIG._9B

GATE DRIVE CIRCUIT

FIELD OF THE INVENTION

The present invention relates to transistor and switching device drive circuits for electrical power converters, power transfer applications, and the like.

BACKGROUND OF THE INVENTION

An electrical power converter is used to convert power from an unregulated power source (e.g., rectified AC Mains, or 48 V battery) to a regulated output voltage usable by a particular application, such as a digital integrated circuit using a 5 V power supply. The majority of such power converters employ a power transformer to isolate the output voltage from the input power supply. For efficiency, these power transformers are driven at high frequency, such as for example 50 kHz to 500 kHz, by power transistors, typically power MOSFET transistors. A pulse width modulation (PWM) control circuit is generally used to regulate the output voltage of the converter by varying the pulse width of the drive signals coupled to the power transistors. The PWM control circuit is often required to be isolated from the power transistors for reasons of safety and/or circuit function. For each power transistor, a signal transformer (also called an isolation transformer) is normally used to transmit the control waveform from the PWM control circuit to the power transistor.

A common prior art transistor drive circuit using such an isolation transformer is shown at 10 in FIG. 1. Key voltages of drive circuit 10 are shown at a timing diagram 20 in FIG. 2. Drive circuit 10 is coupled between a PWM control circuit 12 and a MOSFET power transistor $Q_{SW}$, and includes a transformer $T_1$, a first capacitor $C_1$, a second capacitor $C_2$, and a diode $D_1$. The output of control circuit 12 is provided at a node A and the voltage at node A is shown as a function of time at a timing graph 21 in FIG. 2. A 30% duty-cycle and a pulse height of 10 V are shown for the control signal at node A. First capacitor $C_1$ is coupled between control circuit 12 and the primary winding of transformer $T_1$ and is for blocking the application of a D.C. voltage to transformer $T_1$. As is known in the transformer art, the application of a DC voltage to a transformer winding causes the transformer to saturate, which often leads to damage or destruction of the transformer if the voltage is applied for a sufficient duration. Capacitor $C_1$ blocks the D.C. voltage and level shifts the waveform at node A such that an alternating voltage is seen by transformer $T_1$ at a node B, which couples $T_1$ and $C_1$. The voltage at node B is shown at 22 in FIG. 2. The waveform at node A is shifted at node B such that the average volt-seconds applied to the primary winding of transformer $T_1$ is substantially zero. As an example, for a 10 V pulse height at node A with a 30% duty cycle, a positive pulse height of 7 V and a negative pulse height of −3 V appear at node B.

The waveform at node B is "D.C. restored" by capacitor $C_2$ and diode $D_1$ at a node C. Capacitor $C_2$ and diode $D_1$ are coupled in series at node C, and the series combination is coupled across the secondary winding of transformer $T_1$. Diode $D_1$ is orientated such that it may conduct current into the positive terminal of the secondary winding. The cathode of diode $D_1$ provides a ground reference for the secondary circuit of drive circuit 10. Power transistor $Q_{SW}$ is coupled across diode $D_1$, with its source terminal coupled to the anode of $D_1$ and its gate terminal coupled to the cathode. The voltage at node B is replicated to the secondary winding of $T_1$ by transformer action. The secondary voltage is coupled to node C by capacitor $C_2$, with diode $D_1$ setting the negative pulse height to −0.5 V by forward conduction. This causes the positive pulse height to be restored to a value of 9.5 V, near to the original 10 V value. The waveform at node C is shown at a graph 23 in FIG. 2.

Transistor drive circuit 10 provides good isolation between control circuitry 10 and transistor $Q_{SW}$ with reasonable efficiency. However, because of stored energy in capacitors $C_1$ and $C_2$, drive circuit 10 has difficulty in cleanly turning off transistor $Q_{SW}$ when the power converter terminates operation. Whenever the power converter is turned off or the load removed from the converter's output, control circuitry 10 stops generating the pulsed signal at node A, with the output at node A being held low near zero volts. This is shown at $t_0$ in FIG. 2. At time $t_0$, the voltage across the secondary winding of $T_1$ is −3 V and the gate-to-source voltage of $Q_{SW}$ is approximately −0.5 V, due to the forward voltage drop across $D_1$. The magnetizing inductance of transformer $T_1$, which stores magnetic energy as described below in greater detail, begins to resonate with capacitor $C_1$. Without any damping in the primary or secondary circuits, this resonance causes the secondary winding voltage to swing from −3 V to +3 V, back to −3 V at a frequency relatively slow in comparison to the previous switching frequency of the control signal. This is shown in graph 22 for time greater than $t_0$. The gate-to-source voltage of transistor $Q_{SW}$ tracks the secondary winding voltage and swings from −0.5 V to +5.5 V, back to −0.5 V, as shown in graph 23.

As transistor $Q_{SW}$ has a threshold voltage in the range of +3 V to 5 V, $Q_{SW}$ is turned on by the resonance even though control circuit 12 has set its output at node A to a low state. If transistor $Q_{SW}$ is coupled to a power transformer of a power converter, as is often the case, it will couple power and voltage to the converter's power transformer for a relatively long period of time. This results in the power transformer saturating, with unlimited current flowing into the power transformer. As a consequence, damage to the power transformer and possibly to other components of the power converter may occur.

The prior art has addressed this problem by coupling a damping resistor in parallel across either the signal transformer $T_1$ or the gate and source terminals of transistor $Q_{SW}$. Unfortunately, this approach has two drawbacks. First, by introducing a dissipation path, it reduces the efficiency of drive circuit 10. Second, and more importantly, small resistance (high conductance) values are generally needed to critically damp or over damp the resonating circuit in order to be effective. However, the small resistance values lead to excessive power dissipation. Increasing the resistance to achieve more moderate power dissipation levels unfortunately leads to an under-damped resonating circuit and, consequently, to a circuit which has the above shut-off problem. Thus, in solving the resonance problem, the prior art approach has created a new problem of high power dissipation and resultant reduced power efficiency.

SUMMARY OF THE INVENTION

The present invention recognizes that the above-described resonance is caused by the energy stored in the capacitors $C_1$ and $C_2$ by the voltages thereon, the voltage being transferred to the switching transistor $Q_{SW}$ upon termination of the control signal. The present invention further recognizes that the resonance problem may be solved by eliminating capacitors $C_1$ and $C_2$ and by driving the signal transformer $T_1$ in a manner which does not result in a net DC voltage across the primary winding of the signal transformer $T_1$.

In a preferred embodiment of the present invention, the secondary winding of the signal transformer is coupled to the switching device, and the primary winding of the signal transformer is coupled in series with the control signal and a transistor switch. The primary winding has a first terminal coupled to the control signal and a second terminal coupled to the transistor switch. The conduction path of the transistor switch is coupled between the primary winding's second terminal and a reference voltage, such as ground. The transistor switch has a control terminal coupled to the control signal. The control signal has a first state for directing the switching device to enter a first conduction state and a second state for directing the switching device to enter a second conduction state. When the control signal enters its first state, a voltage is applied from the control signal to the first terminal of the primary winding and the reference voltage is coupled to the second terminal of the primary winding by the transistor switch. Energy in the form of a voltage having a first polarity is then coupled to the secondary winding, which causes the switching device to change conduction states. Energy is stored in the transformer, and potentially in the switching device, which could cause an erroneous signal if not properly discharged according to the present invention. Note that this energy is generally much less that the energy stored in the above-described prior art drive circuits.

When the control signal enters its second state, a low voltage is applied to the first terminal of the primary winding and the transistor switch is rendered non-conductive, isolating the second terminal of the primary winding. Substantially zero volts is thereby initially applied to the windings of the signal transformer, causing the switching device to change conduction states. To discharge the stored energy such that an erroneous signal to the switch device cannot be generated, a rectifier is coupled in parallel with the transistor switch to discharge this energy when the control signal enters its low state. The rectifier is oriented such that it does not substantially conduct current when the control signal is in its first state. When the control signal is in its second state, the rectifier limits the voltage having the first polarity across the transformer windings so that sufficient energy cannot be coupled to the switching device to cause it to switch. However, the rectifier enables voltage having a second polarity to be generated across the transformer windings so that the core of the signal transformer may be reset to prevent core saturation. In this way, energy from the transformer and the switching device may be discharged without generating an erroneous control signal.

Broadly stated, the invention encompasses a drive circuit for controlling the operation of a switching device, such as for example a power switch of a switch mode power converter. The drive circuit is responsive to an input control signal which has a first state for directing the switching device to enter a first conduction state and a second state for directing the switching device to enter a second conduction state. The input control signal alternates between its first and second states during normal operation. When the operation of the switching device is to be terminated, the input control signal is caused to remain in its second state, thereby causing the switching device to remain in its second conduction state. The switching device includes a control port for receiving a signal from the drive circuit for controlling its conductance states.

The drive circuit according to the present invention comprises an output port for coupling to the control port of the switching device, and a transformer having a primary winding and a secondary winding. The secondary winding is coupled to the output port and, in turn, to the control port of the switching device. During the first state of the input control signal, the drive circuit according to the present invention couples power to the transformer's primary winding, the power having a voltage of a first polarity. Power is in turn coupled to the control port of the switching device, causing the switching device to enter its first conduction state. Energy may be stored in said transformer, and may be stored by the switching device depending upon its nature. When the input control signal is caused to remain in its second state to terminate the operation of the switching device, the stored energy can potentially generate an incorrect control to the switching device, as indicated above for the prior art transistor drive circuit. However, the present invention prevents this from occurring.

Upon the input control signal entering its second state, the present invention uncouples power from the primary winding (e.g., open-circuits the primary) and initially forces the voltage across the primary and secondary windings to substantially zero volts. The forcing of the winding voltages to substantially zero volts uncouples power from the switching device to cause the switching device to change to its second conduction state. The present invention further comprises a discharge means coupled to the transformer and the output port for discharging, during the time the input control signal is in its second state, energy that may be stored by the transformer and the switching device. The stored energy is discharged such that sufficient power cannot be coupled to the switching device to cause the switching device to enter its first conduction state while the input control signal is its first state.

Embodiments according to the present invention do not require the large coupling capacitors of the prior art and may be implemented with a very small number of components. Additionally, all of the components, with the present exception of the transformer, may be integrated on one or more semiconductor chips. The components coupled to the primary winding may be integrated on a first semiconductor chip, as for example along with other control circuitry for the converter, and the components coupled to the secondary winding may be integrated with the switching device. The volume of the drive circuit according to the present invention may therefore be reduced substantially to the volume of the transformer.

Accordingly, it is an object of the present invention to provide a drive circuit which cleanly shuts down the operation of a switching device upon termination of a control signal.

It is another object of the present invention to provide a drive control signal to a switching device of a power converter to cause said device to enter a well defined shutoff state when the power converter terminates operation.

It is yet an object of the present invention to isolate the switching device from its drive circuitry while preventing the storage of residual energy within the drive circuit according to the present invention.

It is still another object of the present invention to provide a drive circuit for a switching device which has fewer components and a more compact size relative to prior art drive circuits.

It is still another object of the present invention to enable substantial portions of the drive circuit according to the present invention to be integrated with the control circuitry on a semiconductor chip so as to further reduce the size of the drive circuit.

These and other objects of the present invention will become apparent to those skilled in the art from the following detailed description of the invention, the accompanying drawings, and the appended claims.

BRIEF DESCRIPTION OF THE DRAWINGS

FIG. 1 is a schematic diagram of a drive circuit according to the prior art.

FIG. 2 is a timing diagram of key voltages of the drive circuit shown in FIG. 1 according to the prior art.

FIG. 3 is a schematic diagram of a first embodiment of the drive circuit according to the present invention.

FIG. 4 is a timing diagram of key voltages and currents of the drive circuit shown in FIG. 3 according to the present invention.

FIG. 5 is a schematic diagram of a second embodiment of the drive circuit according to the present invention.

FIG. 6 is a schematic diagram of a third embodiment of the drive circuit according to the present invention.

FIG. 7 is a timing diagram of key voltages and currents of the drive circuit shown in FIG. 6 according to the present invention.

FIG. 8 is a schematic diagram of a fourth embodiment of the drive circuit according to the present invention in which the switch means comprises a complimentary device.

FIG. 9A is a schematic diagram of a fifth embodiment of the drive circuit according to the present invention which is integrated on a semiconductor chip.

FIG. 9B is a schematic diagram of an alternate secondary side circuit for the embodiment of the drive circuit shown in FIG. 9A.

FIG. 10 is a schematic diagram of an exemplary control means according to the present invention.

DETAILED DESCRIPTION OF THE INVENTION

A first embodiment of the switching device drive circuit according to the present invention is shown at 100 in FIG. 3. Also shown in FIG. 3 are a switching device 15, such as a transistor ($Q_{SW}$); a pulse-width-modulation (PWM) control means 12 which generates a control signal $V_A$ for directing the operation of switching device 15 as required by the application environment (e.g., electrical power converter and the like); and a voltage supply $V_{DD}$ (e.g., +10 V) for supplying power to PWM control means 12. An exemplary control means is the AS3842/3/4/5 Current Mode PWM Controller manufactured by Astec Semiconductor. Control signal $V_A$ has a first state for directing switching device 15 to enter a first conduction state and a second state for directing switching device 15 to enter a second conduction state. In a preferred embodiment, the first conduction state is a conducting state in which current may be conducted by switching device 15 and the second conduction state is a non-conducting state in which current is substantially prevented from being conducted. In a preferred embodiment of drive circuit 100, the first state of control signal $V_A$ comprises a voltage level of approximately +9 volts to +10 volts and the second state comprises a voltage level of approximately zero volts. Control signal $V_A$ alternates between its first and second states during normal operation and is preferably caused to remain in its second state when operation of the switching device is to be terminated.

Drive circuit 100 includes an input port 101 for receiving control signal $V_A$ and an output port 102 for providing an output control signal to switching device 15. In turn, switching device 15 includes a control port, such as for example its gate and source terminals when device 15 comprises a MOSFET device, coupled to output port 102 for receiving a signal therefrom for controlling its conductance state. As described below, the output control signal at port 102 includes first and second states for directing the operation of switching device 15 which closely follow the first and second states of input control signal $V_A$, respectively. Drive circuit 100 also comprises a transformer 120 having a primary winding 122 and secondary winding 124, and a switch means 110 coupled in series with primary winding 122. Primary winding 122 has a first terminal, the positive terminal shown in FIG. 3, coupled to control signal $V_A$ at input port 101 and a second terminal, the negative terminal shown in FIG. 3, coupled to switch means 110 at one of the conduction terminals of switch means 110. The voltage at the negative terminal of primary winding 122 is designated at voltage $V_B$ in FIG. 3.

The other conduction terminal of switch means 110 is coupled to a reference voltage, such as ground. Switch means 110 also includes a control terminal responsive to control signal $V_A$ at port 101 and coupled thereto. Switch means 110 closes (i.e., becomes conductive) in response to control signal $V_A$ entering its first state and opens in response to control signal $V_A$ entering its second state. In a preferred embodiment of the present invention, switch means 110 comprises an enhancement-type NMOS field-effect transistor (N-MOSFET) having a drain terminal coupled to primary winding 122, a source terminal coupled to ground, and a gate terminal coupled to port 101. Such a MOSFET device is preferred because of its fast switching capability. However, it may be appreciated that an NPN-type bipolar junction transistor (BJT), having a suitable base resistance coupled in series with the base terminal of the BJT transistor, may also be used.

Additionally, drive circuit 100 includes a capacitor 134 coupled between the negative terminal of primary winding 122 and ground for representing the combined stray (parasitic) capacitances of primary winding 122 and switch means 110. It may be appreciated that each of primary winding 122 and switch means 110 may include a parasitic capacitance, resulting from the non-ideal elements used in implementing each of these components. The parasitic capacitance of each of these components may, for example, be represented by a parasitic capacitor for each component terminal, each parasitic capacitor being coupled between its respective component terminal and ground. An exemplary value for this capacitance is approximately 15 pF.

When control signal $V_A$, enters its first state, the first voltage level of signal $V_A$ (approximately +9 V) is coupled to the positive terminal of primary winding 122 and switch means 110 is rendered conductive, thereby grounding the negative terminal of winding 122. This couples a positive voltage (i.e., a voltage of a first polarity) of approximately +9 V to primary winding 122 and, by transformer action, a positive voltage at port 102. In this manner, power is coupled to transformer 120 (by way of winding 122), and a portion of this power is coupled to the control port of switching device 15, causing it to enter its first conduction state. In one embodiment, switching device 15 comprises an NMOS field effect transistor having its gate terminal coupled to the positive terminal of secondary winding 124 and its source terminal coupled to the negative terminal of winding 124. With this coupling, the positive voltage across port 102 renders switching device 15 conductive. (However, with the coupling of gate and source terminal reversed, the positive voltage could be used to render switching device 15 non-conducting). Because of the gate capacitance of switching device 15, energy is stored at port 102, which is later discharged when control signal $V_A$ enters its second state. As explained in greater detail below, energy is also stored in the core of transformer 120 when signal $V_A$ is in its first state, which is later discharged when control signal $V_1$, enters its second state.

When control signal $V_A$, enters its second state, preferably a voltage of zero volts, the positive terminal of primary winding 122 is grounded and switch means 110 is rendered non-conductive. With capacitor 134 discharged and near the reference voltage of zero volts, the change to the second state for $V_1$ initially couples near zero volts across windings 122 and 124. Power is thereafter uncoupled from the secondary winding of transformer 120 and from the control port of switching device 15. As a result, the capacitance coupled to port 102 begins to discharge, reducing the voltage at port 102 and causing switching device 15 to change conduction states (i.e., change to its second conduction state). In a preferred embodiment of the present invention, a resistor 140 is coupled in series with secondary winding 124 to limit the peak discharge rate. Additionally, and as explained further below, the stored energy in transformer 120 causes the voltage across primary winding 122 to reverse polarity to a second polarity (e.g., negative), which is opposite to the first polarity. This then causes the voltage $V_B$ at the negative terminal of winding 122 to rise and direct current into capacitor 134. The voltage across both windings 122 and 124 becomes negative, thereby further causing switching device 15 to change conduction states, as for example to a non-conducting state when switching device 15 comprises an NMOS device.

In a preferred embodiment, drive circuit 100 further includes a first rectifier 131 coupled between the negative terminal of winding 122 and ground. Rectifier 131 is oriented as shown in FIG. 3 and operated to limit the negative excursion in the voltage $V_B$ to preferably approximately −0.8 V. Rectifier 131 may be implemented as a body diode of switch means 110. As described in greater detail below, the present invention limits the long term build up of stored energy in transformer 120 and discharges the stored energy during each second state of the input control signal $V_A$ such that stored energy cannot subsequently change the conduction state of switching device 15 when PWM control means 12 terminates operation.

The storage of magnetic energy by transformer 120 is described as follows. An imaginary inductor 123 ($L_M$) is indicated, in phantom, in the circuit diagram for transformer 120 to model the effects of stored magnetic energy and magnetizing current of transformer 120. As is well known in the transformer art, a current must be provided to one of windings of a real transformer to provide the magnetomotive force required to overcome the magnetic reluctance of the transformer's core. This current is known as the magnetizing current $I_M$ and is generally provided to the primary winding of the transformer. Since an ideal transformer does not have any magnetic reluctance, magnetizing currents are not present in an ideal transformer. In a real transformer, the magnetizing current $I_M$ can be electrically modeled by a phantom inductor coupled in parallel with the primary winding of an ideal transformer, as shown by inductor 123. This is because the magnetizing current $I_M$ is proportional to the time integral of the voltage appearing across the primary winding of the transformer. The inductance value $L_M$ of the phantom modeling inductor 123 is set to a value representative of the core reluctance of transformer 120, as is well known in the transformer art. The magnetic energy stored in the transformer is related to the magnetizing inductance $L_M$ and the magnetizing current by the following general relationship: magnetic energy $= \frac{1}{2} L_M I_M^2$. The use of modeling inductor 123 in this manner is well known to the transformer art. Nonetheless, it is important to recognize that inductor 123 is not a real component of transformer 120 but rather an imaginary modeling component which aids in explaining the characteristic behavior of the magnetizing energy in real transformer 120.

The magnetizing current $I_M$ is a parasitic effect and does not exist in an ideal transformer. As such, the magnetizing current component in the primary winding of an ideal transformer is not transformed into current in the secondary winding. The current flowing in secondary winding 124 is related to the current flowing into primary winding 122 and is not directly related to the magnetizing current flowing in inductor 123. For the purposes of understanding the operation of real, non-ideal transformer 120, primary winding 122 and secondary winding 124 function as an ideal transformer while inductor 123 functions to account for the magnetizing current $I_M$ in transformer 120. Under certain circumstances, either a portion or all of the magnetizing current $I_M$ in inductor 123 can be directed into primary winding 122 and thereafter transformed over to secondary winding 124. Finally, as a point of generality, inductor 123 can be coupled in parallel with secondary winding 124 rather than with primary winding 122 to represent the magnetizing current.

As is also known in the transformer art, transformers having a ferromagnetic core have power dissipation losses associated with the ferromagnetic material. The power dissipation losses are primarily causes by hysteresis in the magnetizing characteristic of the material, as may be seen in the material's B-H curve, and by eddy currents generated in the core. Additional current must be supplied to the transformer from one of the windings or from the stored energy (as represent by inductor 123) to account for the dissipation losses. The eddy currents are generally proportional to the rate of change in the core's magnetic flux (i.e., proportional to $d\phi/dt$), and are largest as the flux passes through zero webers. As such, the eddy currents are in phase with the applied voltage and, as is known in the transformer art, the power dissipated by the eddy currents may be modeled by a resistor $R_{eddy}$ coupled in parallel with either the primary or secondary winding.

The hysteresis loss is a highly non-linear and time-dependent (i.e., frequency) function of the rate of magnetic flux change ($d\phi/dt$), and is generally largest when the flux passes through zero webers. As a basic approximation over a given frequency operating range, the power dissipated by the hysteresis losses may be modeled by a resistor $R_{hyst}$ coupled in parallel with either the primary or secondary winding, as is known in the art. Although more complicated approaches for modeling the hysteresis losses are known, such as for example having $R_{hyst}$ be a time-varying, non-linear resistor, the above linear resistor approach is suitable for understanding and practicing the present invention. Accordingly, both resistors $R_{eddy}$ and $R_{hyst}$ may be represented by a single resistor $R_{CORE}$ coupled in parallel with the primary or secondary winding.

Accordingly, an imaginary resistor 125 ($R_{CORE}$) is indicated, in phantom, in the circuit diagram for transformer 120 to model the above-described core losses. For convenience, core-loss resistor 125 is coupled in parallel with primary winding 122, and in parallel with magnetizing inductor 123. The resistance value $R_{CORE}$ of phantom modeling resistor 125 is set to a value representative of the core dissipation losses of transformer 120 in the frequency range of interest, as is well known in the transformer art. One way of determining an approximate value for $R_{CORE}$ is to open-circuit the secondary winding and apply a square-wave voltage signal to the primary winding, the voltage signal preferably having a 50% duty cycle, a frequency in the range of interest, and equal positive and negative voltage excursions. Without core losses, the primary current should be a continuous function of time, ramping up at a constant rate $+A$ when positive voltage is applied and ramping down at a constant rate $-A$ when negative voltage is applied. With significant core losses, discontinuities in the primary current occur between each ramp-up and ramp-down period. The approximate value of $R_{CORE}$ is obtained by dividing the peak-to-peak voltage difference by the magnitude of the current discontinuity.

Although the use of modeling resistor 125 is well known to the transformer art, it is important to recognize that resistor 125 is not a real component of transformer 120 but rather an imaginary modeling component which aids in explaining the characteristic behavior of the eddy currents and magnetic hysteresis in the core of real transformer 120. The eddy and hysteresis currents are parasitic effects and do not exist in an ideal transformer. As such, the current flowing through resistor 125 is not transformed into current in the secondary winding. As stated above, the current flowing in secondary winding 124 is related to the current flowing into primary winding 122 and is not directly related to the current flowing in either resistor 125 or inductor 123. However, this is not to say that current coupled to secondary winding 124 cannot supply core loss current to resistor 125. In fact, under certain circumstances, either a portion or all of the secondary current can be reflected over to primary winding 122 and thereafter coupled to resistor 125. Finally, as a point of generality, resistor 125 can be coupled in parallel with secondary winding 124 rather than with primary winding 122 to represent the core losses.

Thus, there are five key currents associated with transformer 120 shown in FIG. 3: the core loss current $I_{CORE}$ through resistor 125, the magnetizing current $I_M$, the ideal primary current $I_1$ through winding 122, the total primary current $I_P$, and the secondary winding current $I_s$ through winding 124. Current $I_P$ represents the current flowing into the primary winding of a real transformer, current $I_M$ represents the component of primary current $I_P$ needed to overcome the reluctance of the real transformer, current $I_{CORE}$ represents the component of primary current $I_P$ needed to overcome the core losses of the real transformer, and current $I_1$ represents the component of primary current $I_P$ which is actually transformed over to the secondary winding current $I_s$ of the real transformer. Currents $I_1$ and $I_S$ follow the well known current law for ideal transformers: $I_1/I_S = N_S/N_P$, where $N_P$ is the number of primary winding turns and $N_s$ is the number of secondary winding turns.

In addition to the above-described core losses, each of the windings of transformer 120 has a power loss due to the resistance of the metal wire used to form the windings. For typical transformers used in the present invention, these losses are much smaller than the above-describe core-losses, and may therefore be ignored.

A detailed description of the operation of drive circuit 100 is now given with reference to a timing diagram of key voltage and currents of circuit 100 shown at 180 in FIG. 4. The voltages and current shown in diagram 180 are shown as a function of time and are approximate in nature. The input control signal voltage $V_A$ is shown at a timing graph 181 in FIG. 4; the voltage $V_B$ is shown at a timing graph 182; the magnetizing current $I_M$ and secondary winding current $I_s$ are shown at a timing graph 183; the total primary current $I_P$ is shown at a timing graph 184; and the voltage across port 102, $V_{102}$, is shown at a timing graph 185. For timing graph 180, an exemplary one-to-one turns ratio is taken for transformer 120 and an exemplary MOSFET switching transistor is coupled to output port 102 with its gate terminal coupled to the positive terminal of secondary winding 124. Also shown in timing diagram 180 are a number of time points $t_0$ through $t_6$, each time point being represented by a dashed line passing vertically through graphs 181–185. The time duration between $t_0$ and $t_6$ represents a complete switching cycle for switching device 15 ($Q_{SW}$). The operation of drive circuit 100 at each time point and between time points is described below. For the purposes of explanation and without loss of generality, the following exemplary values for the components of drive circuit 100 listed in TABLE I are taken.

TABLE I

| | |
|---|---|
| Switch means 110 | 2N7000 FET |
| Capacitor 134 | ~15pF |
| Magnetizing Inductance 123 | 100uH |
| Transformer Turns Ratio | 1:1 (pri:sec) |
| Approximate Value for $R_{CORE}$ | 1000 ohms |
| Resistor 140 | 10 ohms |
| Average Capacitance at port 102 with positive gate voltage | ~1.1 nF |
| Average Capacitance at port 102 with negative gate voltage | ~0.74 nF |
| Switching Period | ~2.0 μs |
| Time $V_A$ is in First State | ~0.8 μs |

At time $t_0$, the input control signal $V_a$ enters its first state of, for example, $\sim +8.7$ V (which is lower than the 10 V $V_{DD}$ supply due to voltage drop in the driver stage of PWM circuit 12). Switch means 110 is turned on and the $\sim +8.7$ V volts supplied by control signal $V_A$ is coupled to primary winding 122 and to magnetizing inductor 123. Because of voltage loss across switch means 110, approximately 8.5 V is applied across primary winding 122. By transformer action, $\sim +8.5$ V is coupled to secondary winding 124, charging the capacitance of switching device 15 between times $t_0$ and $t_1$. At time $t_1$, the capacitance at port 102 is fully charged and the voltage at port 102 is at $\sim +8.5$ V (cf. graph 185). In response to the change in voltage at port 102, switching device 15 switches to its first conduction state (preferably fully conductive). Due to the charging, a current pulse appears in the secondary current $I_S$ (cf. graph 183), which is reflected to primary winding 122 and appears in the total primary current $I_P$ (cf. graph 184).

Input control signal $V_A$ remains in its first state until time $t_2$. During the time interval from $t_0$ to $t_2$, the magnetizing current $I_M$ flowing in inductor 123 increases at a substantially constant rate from a negative value of $\sim -23$ mA at time $t_0$ to a positive value of $\sim +44$ mA at time $t_2$. The total change in magnetizing current is approximately 67 mA ($dI_M \sim 8.5$ V*0.8 $\mu$s/100 $\mu$H). The negative starting value for $I_M$ is explained in greater detail below. The increasing magnetizing current is coupled to the total primary current $I_P$ during this time, as seen in graph 184. The primary current $I_P$ also includes an average current of $\sim 9$ mA (+8.7 V/$R_{CORE}$) during this time to account for core losses.

At time $t_2$, the input control signal $V_A$ enters its second state (e.g., zero volts), forcing the voltage across the transformer winding to substantially zero volts, as described above. During the time interval between time $t_2$ and time $t_3$, the capacitance of switching device 15 is discharged through secondary winding 124 because of the zero volts appearing across the winding. Resistor 140 limits the peak discharge current into winding 124. This discharge current is reflected to the primary winding current $I_1$ by transformer action, entering the negative terminal of winding 122 and exiting the positive terminal thereof. During this time, the magnetizing current $I_M$ and the reflected $I_1$ current flow in different directions (cf. graph 183) and the primary current $I_P$ is equal to the difference in the currents (core loss current is near zero since the winding voltage is near zero). The magnitude of magnetizing current $I_M$ is generally smaller that the magnitude of the reflected secondary current. This causes a negative primary current $I_P$, which flows through rectifier 131. This is shown in graph 184 during the initial portion of time interval $t_2$–$t_3$ as a negative current, and in graph 182 by a negative voltage for $V_B$. At time $t_3$, the capacitance at port 102 is substantially discharged to zero volts.

In some instances, the magnitude of magnetizing current $I_M$ may be larger than the reflected secondary current, as for example when a very low capacitive load is present at port 102. In these cases, a positive current flows into capacitor 134 instead of rectifier 131, raising its voltage (voltage $V_B$). The rise in voltage is transformed to secondary winding 124, appearing as a negative voltage across winding 124, and accelerates the discharge of the capacitance at port 102.

The core-loss current $I_{CORE}$ goes substantially to zero at time $t_2$ due to the near zero voltage across the primary winding. Normally this may be seen as a discontinuity in the primary current. However, the reflected secondary current which occurs between times $t_2$ and $t_3$ masks the discontinuity.

At time $t_3$, the magnetizing current $I_M$ has three paths into which it can flow: into capacitor 134, into core-loss resistor 125, and into ideal primary winding 122 to be transformed to secondary winding 124 and into the capacitance coupled to winding 124. A parallel RLC resonant circuit is formed by these elements. Specifically, this RLC circuit is the parallel combination of resistor 125, inductor 123, capacitor 134, and the series combination of resistor 140 and the capacitance at port 102 by way of transformer 120. (Because of the one-to-one turns ratio of transformer 120, the series combination of resistor 140 and the capacitance at port 102 may be coupled to this parallel circuit for the purposes of analysis without alteration of their component values. If a different turns ratio is used, an equivalent impedance may be calculated for this series combination may be calculated with the well known transformer impedance law.) With the above component values, resistor 140 has little impact on the RLC circuit, and therefore may be eliminated from the RLC analysis. This allows the capacitance at port 102 to be effectively combined with capacitor 134 in the RLC analysis. With an inductance of 100 $\mu$H, a combined capacitance of $\sim 0.75$ nF (negative gate voltage assumed), and a resistance of $\sim 1000$ ohms, the parallel RLC circuit is under-damped and has a resonant period of $\sim 1.7$ $\mu$seconds (580 kHz).

From time $t_3$ to time $t_5$, a half-period of damped resonance occurs, with the midpoint occurring at time $t_4$ where the voltage $V_B$ reaches a peak value of approximately 12 V. At the beginning of the resonance at time $t_3$, the voltage $V_B$ (cf. graph 182) is substantially at zero and the magnetizing current $I_M$ in inductor 123 is at a value of approximately 44 mA (cf. graphs 183 and 182). From time $t_3$ to $t_4$, the magnetizing current $I_M$ flows into resistor 125 and the combined capacitance of port 102 and capacitor 134. Voltage $V_B$ becomes more positive and, correspondingly, the voltage across windings 122–124 becomes more negative. The negative winding voltage causes the magnetizing current to decrease in value towards zero amperes. The current flow into the capacitance at port 102 is shown by the secondary current $I_s$ in graph 183, and the current into capacitor 134 is shown by the primary current $I_P$ in graph 184. (Because capacitor 134 is approximately 1/15$^{th}$ the value of the capacitance at port 102, the current into capacitor 134 is a small fraction of the total current into the capacitances. Hence, the primary current $I_P$ coupled to capacitor 134 during this time is only slightly visible in graph 184.)

A short time after voltage $V_B$ reaches its peak at time $t_4$, the magnetizing current $I_M$ reaches zero amperes. This is shown at point 190 in graph 183. Without the core losses represented by $R_{CORE}$ (i.e., in a loss-less parallel LC circuit), the magnetizing current $I_M$ would reach zero amperes at the same time the voltage $V_B$ across the capacitance peaks (time $t_4$). However, because the core loss resistor $R_{CORE}$ needs to be supplied with current and because the capacitance does not supply current at its peak voltage, the magnetizing current $I_M$ supplies the core loss current and is at a positive value of approximately 12 mA when voltage $V_B$ peaks. Hence, point 190 occurs after time $t_4$, where voltage $V_B$ is ramping down in value and the current from discharging the capacitance is sufficient to supply the core loss current.

By time $t_4$, most of the energy of the RLC circuit is in the capacitance of port 102 and capacitor 134, and by point 190, all of the energy is in the combined capacitance. From point 190 to $t_5$, the energy in this capacitance now drives the RLC circuit and supplies the current for the core losses. Also, with a negative voltage across inductor 123, the magnetizing current $I_M$ reverses to a negative value. Both the core loss current and the increasingly negative magnetizing current discharge the energy stored by the capacitance and reduce the voltage $V_B$. At time $t_5$, voltage $V_B$ reaches a slightly negative value of $\sim -0.8$ V due to rectifier 131 conducting. At the same, time the magnetizing current $I_M$ reaches a negative value of $\sim -25$ mA, which is a magnitude significantly less than the 44 mA it had at time $t_3$. At time $t_3$, the magnetizing current $I_M$ stored approximately 96 nJ of energy. At time $t_5$, because of the core losses, it only stores approximately 31 nJ of energy.

With voltage $V_A$ grounded, the voltage at port 102 is a near mirror image of voltage $V_B$ (cf. graph 185). Thus, the transistor device at port 102 is maintained in its second conduction state, preferably non-conducting.

From time $t_5$ to time $t_6$, the voltage $V_B$ is clamped at approximately $-0.8$ V for approximately 0.15 $\mu$s. The voltage at port 102 rises to a positive value of approximately 0.8 V, which is substantially below the threshold of switching device 15. According, sufficient energy is prevented from being coupled to switching device 15 to causes it to enter its first conducting state and device 15 remains substantially in its second conduction state (preferably non-conducting). During time $t_5$ to time $t_6$, the magnetizing current flows from rectifier 131 to input port 101 and approximately $\sim 0.8$ V is coupled to primary winding 122 and inductor 123. Due to this small positive voltage, the magnetizing current increases in value from $\sim -25$ mA at time $t_5$ to $\sim -23$ mA at time $t_6$ (but its absolute magnitude decreases, thereby decreasing the amount of stored energy). As time $t_6$ corresponds to time $t_0$ in the switching cycle, the magnetizing current $I_M$ begins the switching cycle with a negative value, as described above. However, the negative magnitude of the magnetizing current $I_M$ at times $t_0$ and $t_6$ is less than its positive magnitude at time $t_2$ and, under steady-state conditions, the magnetizing current will have a positive value at time $t_2$ in order to carry out the resonance with the capacitance of port 102 and capacitor 134 during the interval $t_3$–$t_5$.

By the following feedback mechanism, the peak voltage across the capacitance of port 102 and capacitor 134 adjusts to a value which keeps the waveform for the magnetizing current $I_M$ over many switching cycles centered close to zero amperes. Assuming steady state conditions, if the magnetizing current waveform is offset by a positive value, more average current will flow into the capacitance. This increases the peak value for $V_B$, which in turn applies more reversing voltage during time interval $t_3$–$t_5$, which then acts to lower the waveform over several switching cycles. Conversely, if the magnetizing current waveform is offset by a negative value, less average current will flow into the capacitance. This decreases the peak value for $V_B$, which in turn applies less reversing voltage during time interval $t_3$–$t_5$, which acts to raise the waveform over several switching cycles. Thus, the stored energy in transformer 120 is kept at a minimum amount.

At time $t_6$, the cycle is repeated, with the input control signal $V_A$ again entering its first state (i.e., going high again). However, if the cycle is not repeated (i.e., the pulse during times $t_0$–$t_2$ was the last pulse in control signal $V_A$), the switching device 15 will not be turned on at time $t_5$ or thereafter. This is because the voltage at node A is kept at zero by PWM control circuit 12 and the voltage at node B is kept at near zero voltage by rectifier 131. Therefore, a substantial positive voltage across primary winding 122 cannot be generated. Energy stored in any parasitic elements within the circuit, such as inductor 123, capacitor 134, and the capacitance coupled to port 102, will not be able to force the voltage at node B negative to any substantial degree because the orientation of the body diode 131 would cause diode 131 to conduct and clamp the voltage to a slight negative value. Therefore, it is not possible for the voltage of at port 102 to rise substantially above zero (e.g., such as more than $\sim 0.7$ V to $\sim 0.9$ V.). Therefore, sufficient power is prevented from being coupled to switching device 15 to cause it to enter its first conduction state during the time the input control signal is in its second state.

It may be appreciated that control signal $V_A$, switch means 110, and the coupling of switch means 110 and control signal $V_A$ in the above-described manner collectively comprise a coupling means responsive to the input control signal $V_A$ for coupling power having a voltage of a first polarity to primary winding 122 when input control signal $V_A$ is in its first state. A portion of this power is coupled to the control port of switching device 15 by secondary winding 124 and causes switching device 15 to enter its first conduction state. These components also collecting comprise means for uncoupling the power from primary winding 122 and substantially removing voltage of the first polarity from the transformer windings when control signal $V_A$ enters its respective second state. Power is thereafter uncoupled from secondary winding 124 and from the control port of switching device 15, causing switching device 15 to enter its second conduction state.

It may also be appreciated that capacitor 134, control signal $V_A$, switch means 110, and the coupling of switch means 110 and control signal $V_A$ in the above-described manner collectively comprise a forcing means for initially forcing the voltage across primary winding 122 to substantially zero volts when the input control signal $V_A$ enters it second state. The forcing means initiates the discharge of the energy stored by any capacitance at the control port of switching device 15.

Additionally, rectifier 131, capacitor 134, and the above-described coupling of control signal $V_A$ to transformer 120 collectively comprise a discharge means for discharging, during the time the input control signal is in its second voltage state, the energy stored in the transformer and any energy stored in the capacitance coupled to the output such that sufficient power is prevented from being coupled to switching device 15 to cause it to enter its first conduction state during the time control signal $V_A$ is in its second state. Specifically, in a preferred embodiment, this discharge means reduces the magnitude of the winding voltage in the first polarity to less than a predetermined value, causing the switching device to remain in its second conduction state when the converter's operations are terminated. The discharge means also enables the voltage across the transformer windings (e.g., primary winding 122) to reverse to the second polarity in a time interval during the second voltage state of input control signal $V_A$ so as to discharge energy from transformer 120 and to enable the transformer's core to reset. Specifically, the opening of switch means 110 and the coupling of capacitor 134 to the floating terminal of primary winding 122 collectively comprise a reversal means for applying a voltage having a second polarity opposite to the first polarity across primary winding 122 in a time interval during the second state of control signal $V_A$, the second polarity voltage discharging the energy stored in transformer 120.

In the embodiment shown in FIG. 3, the above predetermined value for the first voltage polarity has an exemplary value of ~0.7V to ~0.9 V. In practice, the predetermined value may be any value which is less than the threshold voltage value required to cause switching device 15 to switch to its first conduction state. Typical threshold voltage values for MOSFET switching power devices presently range between 2 and 6 volts. In this regard, it may be appreciated that switch means 110 may comprise a field effect transistor having a threshold less than the threshold of switching device 15, such as for example 1 to 2 volts. In such a case, the FET device of switch means 110 may provide a rectifier function similar to that of rectifier 131 during the second state of control signal $V_A$, where substantially zero volts is applied to the gate and source terminal of the FET device. Specifically, any negative voltage applied to its drain terminal having a value more negative than $-1$ V to $-2$ V would cause current to flow from its source terminal to its drain terminal, thereby clamping the primary winding voltage to approximately $-1$ V to $-2$ V during the second state of control signal $V_A$. If the clamped value is less than the threshold of switching device 15, rectifier 131 may be removed as the FET of switch means 110 provides the rectifying function.

The peak voltage generated at node $V_B$ at time $t_4$ is related to the peak magnitude of the magnetizing current at time $t_2$, and inversely related to the capacitance at port 102 and the core losses. As the duty cycle increases, the time interval $t_0$–$t_2$ increases, causing the peak magnitude of the magnetizing current $I_M$ to increase. This provides more energy to be transferred to the capacitance of port 102 and capacitor 134 during the resonance period. If a smaller gate capacitance is coupled to port 102, the voltage at node B will also increase in order to store the energy provided by the magnetizing current ($0.5\ CV_B^2 \cong 0.5\ L_M I_M^2$ – core losses). It is possible for the voltage $V_B$ to rise up to 25 V – 30 V, which may cause damage to switch means 110 or to switching device 15, or may require more expensive components for switch means 110 to be used. To limit the peak value for voltage $V_B$, a rectifier may be added between node B and the supply voltage $V_{DD}$ to limit the peak positive value of voltage $V_B$ to ~0.5 volts above $V_{DD}$ (e.g., 10 V+0.5 V=10.5 V). This rectifier would also provide the benefit of recycling the transformer's stored energy back to the input supply.

A second embodiment of the present invention using such a clamping rectifier, designated as a rectifier 132, is shown at 200 in FIG. 5. With the exception of rectifier 132, each element of drive circuit 200 is the same as a corresponding element of drive circuit 100. Consequently, the number designation for each of these elements of drive circuit 300 is set to be equal to the number designation of the corresponding element in drive circuit 100. Additionally, drive circuits 100 and 200 operate in the same manner, as described above, with the exception that the peak value of voltage $V_B$ is limited to approximately 10.5 V. When voltage $V_B$ is clamped by rectifier 132, the magnetizing current $I_M$ is diverted into supply $V_{DD}$ rather than the capacitance of port 102 and capacitor 134, and decreases at a constant rate due to the constant reverse voltage appearing across the windings of transformer 120. As such, rectifier 132 forms part of the discharge means for drive circuit 200. Also in the clamped state, core loss resistor 125 draws a substantially constant current. The clamping by rectifier 132 continues until the magnetizing current $I_M$ falls to a value equal to the core loss current in resistor 125, at which time the energy in the capacitances drive the RLC circuit. Voltage $V_B$ then falls to zero and may then be clamped by rectifier 131, as in drive circuit 100, if needed.

It is important to recognize that rectifier 132 is not essential to the present invention, but it is preferable because it limits the maximum positive voltage across switch means 110 and the maximum negative voltage across port 102 to values, which prevents the possibility of damage occurring to these components. Rectifier 132 also provides the benefit of recycling the energy stored by transformer 120 to the supply voltage, thus making drive circuit 200 more power efficient.

The drive circuit according to the present invention will normally need to turn off switching device 15 relatively quickly in order to minimize the power dissipated in device 15 (i.e., switching losses). When switching device 15 comprises a small or medium sized MOSFET transistor (i.e., small gate capacitance), drive circuits 100 and 200 are capable of providing a good shut-off time. For large MOSFET power devices (i.e., large gate capacitance), the turn off time may not be adequate for some converter applications. To provide faster turn off for large power MOSFET transistor devices, the drive circuit according to the present invention may further include a "quick transistor shut-off" circuit, or shunting means, coupled across output port 102 for shunting the terminals of output port 102 together in response to the input control signal entering its second state (e.g., zero volts). Such a shunting means may, for example, include a transistor coupled across the terminals of output port 102 (e.g., across the gate and source terminals of a large power MOSFET device) for quickly discharging the capacitance coupled thereto. Such a shunting means, designated as shunting means 150, is shown in a third embodiment of the present invention at 300 in FIG. 6.

With the exception shunting means 150, each element of drive circuit 300 is the same as a corresponding element of drive circuit 200. Consequently, the number designation for each of these elements of drive circuit 300 is set to be equal to the number designation of the corresponding element in drive circuit 200. Shunting means 150 is coupled to output port 102, between secondary winding 124 and switching device 15, and preferably comprises a shunting transistor 152, which is generally much smaller than switching device 15, and a detection rectifier 151. Shunting transistor 152 preferably comprises an enhancement-type n-channel MOSFET device (e.g., 2N7000) having its gate coupled to the cathode of rectifier 151 and its source terminal coupled to the anode of rectifier 151. Detection rectifier 151 is coupled in series with secondary winding 124 and is for detecting the occurrence of a negative current coupled through winding 124, which occurs when input control signal $V_A$ enters its second state, as describe below in greater detail. As such, rectifier 151 is able to detect when the input control signal $V_A$ enters its second state and, as such, comprises means for detecting the second state.

When $V_A$ enters its first state of $\sim 9$ V, a positive voltage is generated across windings 122 and 124, as described above. The positive voltage across winding 124 couples a current from the positive terminal of winding 124 to port 102 through resistor 140, which returns back to the negative terminal of winding 124 through rectifier 151 in the forward conduction direction of rectifier 151 (i.e., low impedance direction). A small voltage of $\sim 0.5$ V is generated across rectifier 151, which is coupled to shunting transistor 151 as a negative gate-to-source voltage of $\sim 0.5$ V, which maintains shunting transistor 152 in a non-conducting state.

When $V_A$ enters its second state, zero volts is initially coupled to transformer windings 122 and 124, with the aid of capacitor 134 as described above. In response, the capacitance at port 102 couples a negative current into winding 124, which is returned to port 102 by the gate-to-source capacitance of transistor 152 and by any parasitic capacitance of rectifier 151 (i.e., displacement current). A large negative voltage is quickly built up across rectifier 151, due to the small capacitance value of transistor 152 and rectifier 151, which causes shunting transistor 152 to begin conducting, further discharging the capacitance at port 102. Stated another way, the capacitance at port 102 holds the positive terminal of secondary winding 124 at $\sim +9.0$ V and the negative terminal of winding 124, because of the near zero volts across winding 124, pulls the gate of transistor 152 positive to turn on transistor 152.

Also when $V_A$ enters its second state, rendering switch means non-conductive, the magnetizing current $I_M$ in inductor 123 seeks a current path, primarily into capacitor 134. The small amount of negative current coupled through secondary winding 124 by the secondary circuit is transformed over into primary winding 122, which generally diverts a small portion of the magnetizing current away from capacitor 134. The remaining portion of the magnetizing current quickly charges capacitor 134 until the capacitor's voltage reaches $\sim 10.5$ V, at which point rectifier 132 conducts. This couples a negative voltage to windings 122 and 124, which further aids in generating a negative voltage across rectifier 151. Additionally, the negative voltage across secondary winding 124 maintains a positive voltage across transistor 152 during and after the capacitance at port 102 has been discharged.

A more detailed description of the operation of drive circuit 300 is now given with reference to a timing diagram of key voltage and currents of circuit 300 shown at 380 in FIG. 7. The voltages and current shown in diagram 380 are shown as a function of time. The input control signal voltage $V_A$ is shown at a timing graph 381; the voltage $V_B$ is shown at a timing graph 382; the magnetizing current $I_M$ and secondary winding current $I_s$ are shown at a timing graph 383; the total primary current $I_P$ is shown at a timing graph 384; the voltage across port 102, $V_{102}$, is shown at a timing graph 385; and the gate-to-source voltage of transistor 152, $V_{GS,152}$, is shown at a timing graph 386. For timing graph 380, an exemplary one-to-one turns ratio is taken for transformer 120 and an exemplary MOSFET switching transistor is coupled to output port 102 with its gate terminal coupled to the positive terminal of secondary winding 124. Also shown in timing diagram 180 are a number of time points $t_0$ through $t_5$, each time point being represented by a dashed line passing vertically through graphs 381–386. The time duration between $t_0$ and $t_5$ represents a complete switching cycle for switching device 15. The operation of drive circuit 300 at each time point and between time points is described below, taking the above values in TABLE I except for the capacitance at port 102, which is taken to be roughly twice the corresponding value listed in TABLE I.

At time $t_0$, the input control signal $V_A$ enters its first state of, for example, $+9$ V. Switch means 110 is turned on and the 9 volts supplied by control signal $V_A$ is coupled to primary winding 122 and to magnetizing inductor 123. By transformer action, roughly 9 V is coupled to secondary winding 124, charging the capacitance of switching device 15 between times $t_0$ and $t_1$. The charging current generates a negative voltage of $\sim -0.5$ V across the gate and source terminals of shunting transistor 152 by way of detection rectifier 151 (cf. graph 386). At time $t_1$, the capacitance at port 102 is fully charged and the voltage at port 102 is at $\sim +8.7$ V (cf. graph 385). In response to the change in voltage at port 102, switching device 15 switches to its first conduction state (preferably fully conductive). Due to the capacitive charging, a current pulse appears in the secondary current $I_s$ (cf. graph 383), which is reflected to primary winding 122 and appears in the total primary current $I_P$ (cf. graph 384).

Input control signal $V_A$ remains in its first state until time $t_2$, roughly 0.8 $\mu$s. During the time interval from $t_0$ to $t_2$, the magnetizing current $I_M$ flowing in inductor 123 increases at a substantially constant rate and reaches a value of approximately 66 mA at time $t_2$ (cf. graph 383). The increasing magnetizing current $I_M$ is coupled to the total primary current $I_P$ during this time, as seen in graph 384.

At time $t_2$, the input control signal $V_A$ enters its second state (e.g., zero volts), forcing the voltage across the transformer windings to zero volts and rendering switching means 110 non-conductive, as describe above with reference to drive circuit 100. In the secondary circuit at time $t_2$ and shortly thereafter, the capacitance coupled at port 102 quickly discharges into the combined capacitances of transistor 152 and rectifier 151, as described above, and may be seen by the short dip in the primary current $I_P$ at time $t_2$ shown at reference numeral 390. At this time, the magnetizing current $I_M$ completes it current path into capacitor 134, raising voltage $V_B$ (cf. graph 382). The magnetizing current is generally much larger than the current needed to charge transistor 152 to an ON-state, and therefore the voltage across windings 122 and 124 quickly reverses by the charging of capacitor 134. With these two processes, transistor 152 is quickly turned on and maintained in an ON-state, as shown by the gate voltage in graph 386, which in turn rapidly discharges the capacitance at port 102, as shown at time $t_2$ in graph 385. Voltage $V_B$ rises to $\sim 10.5$ V, at which point rectifier 132 conducts and limits a further rise in voltage.

Because of the rapid reversal in the voltage across the transformer windings, the current through core loss resistor 125 undergoes a step reversal from roughly 8.7 mA to roughly $-10$ mA. This step is apparent in the step change in value for primary current $I_P$ at time $t_2$. Just before time $t_2$, the primary current $I_P$ provides the core loss current, as well as the magnetizing current $I_M$. Just after time $t_2$, the magnetizing current $I_M$ must provide the core loss current, leaving less to be coupled through to the primary current $I_P$.

During the time interval from $t_2$ to $t_3$, both currents $I_M$ and $I_P$ ramp down towards zero amperes, and both voltage $V_B$ and the gate-to-source voltage of transistor 152 remain at $\sim 10.5$ V and $\sim -10.5$ V, respectively, holding switching device 15 in its second conduction state (e.g., OFF state). At time $t_3$, the primary current $I_P$ reaches zero, causing rectifier 132 to become non-conducting and to end the clamping of voltage $V_B$.

At time $t_3$, the magnetizing current $I_M$ has three paths into which it can flow: into capacitor 134, into core-loss resistor 125, and into ideal primary winding 122 to be transformed over to secondary winding 124 and into the capacitance coupled to winding 124. A parallel RLC resonant circuit is formed by these elements. Specifically, this RLC circuit is the parallel combination of resistor 125, inductor 123, capacitor 134, and the series combination of resistor 140 and the capacitances associated with transistor 152. Because transistor 152 is still conducting at this time, the capacitance at port 102 is "short-circuited" and does not impact the RLC network. The major capacitances associated with transistor 152 (e.g., 2N7000) are the gate-to-drain capacitance ($\sim 30$ pF), the gate-to-source capacitance ($\sim 30$ pF) and the drain to source capacitance ($\sim 15$ pF). Because transistor 152 is conducting, the drain-to-source capacitance is also short-circuited and does not impact the RLC network. Additionally, the gate-to-source and gate-to-drain capacitance are effectively coupled in parallel by the short between drain and source, thereby providing roughly 60 pF coupled in series with resistor 140.

With the above component values, resistor 140 has little impact on the RLC circuit, and therefore may be eliminated from the RLC analysis. This allows the 60 pF of capacitance associated with transistor 152 to be effectively combined with capacitor 134 in the RLC analysis. With an inductance of 100 $\mu$H, a combined capacitance of $\sim 75$ pF, and a resistance of $\sim 1000$ ohms, the RLC circuit has a resonant period of $\sim 0.67$ $\mu$seconds (1500 kHz), and is heavily damped with a quality factor of $Q=0.87$. The Q-factor is defined as the quantity $R*SQRT(C/L)$. The circuit is under-damped if Q is greater than 0.5, critically-damped if Q is equal to 0.5, and is over-damped if Q is less than 0.5. With a value of 0.87, the above circuit is under-damped and the currents and voltages in the circuit have the form of exponentially decaying sinusoidal functions of time.

At time $t_3$, the voltage $V_B$ is at $\sim 10.5$ V and the magnetizing current $I_M$ is at $\sim +10.5$ mA. At this time, the magnetizing current $I_M$ is ramping down due to the reversing voltage across the transformer windings. The charge stored in the 75 pF capacitance then supplies the portion of current needed by core loss resistor 125 which the magnetizing current can no longer supply. Consequently, voltage $V_B$ falls in value, reaching a value of $\sim 2.5$ V at time $t_4$ within approximately 0.2 $\mu$s. By time $t_4$, the magnetizing current has been reduced to a small positive value ($\sim 1$ mA) by the capacitance. The damping factor for the RLC circuit is quite high ($6.7 \times 10^6$), leading to a quick decay of the stored energy in the RLC network.

At time $t_4$, transistor 152 is rendered non-conducting. This causes the capacitance in the secondary circuit to change dramatically. Specifically, the gate-to-drain and gate-to-source capacitance each go to approximately 7 pF each. The source-to-drain capacitance remains roughly at 15 pF, but is now combined with the relatively large capacitance at port 102 ($\sim 1.5$ nF). With transistor 152 rendered non-conductive, the gate-to-source and gate-to-drain capacitances of transistor 152 are effectively combined in parallel to provide roughly 15 pF to secondary winding 124 by way of resistor 140. Specifically, the gate-to-source capacitance forms a series circuit with the capacitance at port 102, and this series capacitance circuit is coupled in parallel with the gate-to-drain capacitance. Since the capacitance at port 102 is roughly 200 times larger than the gate-to-source capacitance (1.5 nF vs. 7 pF), the capacitance of the series circuit formed by these capacitances is roughly 7 pF.

Thus, both the gate-to-drain and gate-to-source capacitances are coupled together to provide roughly 15 pF to secondary winding 124. This reduces the total capacitance of the RLC network from $\sim 75$ pF to $\sim 30$ pF, causing energy stored in the network to decrease dramatically and the network to become substantially critically damped ($Q=0.5$). From time $t_4$ to time $t_5$, both the voltage $V_B$ and the magnetizing current $I_M$ decay to zero. The gate voltage across transistor 152 and the voltage at port 102 remain at near zero volts until the start of the next pulse from the PWM control means 12 at line $t_5$.

From the above, it may be appreciated that the voltage waveform across the drive transformer is ideal for driving a shunting transistor 152, shown in FIG. 6. As such, shunting means 150 is the simplest (i.e., most compact) and most preferred power-assisted gate turn OFF circuit. However, it may be appreciated that other circuits for providing the shunting function well known in the art may be incorporated into the drive circuit according to the present invention to provide an equivalent function.

Accordingly, rectifier 131, capacitor 134, the above-described coupling of control signal $V_A$ to transformer 120, and shunting means 150 collectively comprise a discharge means for discharging, during the time the input control signal $V_A$ is in its second voltage state, the energy stored in the transformer and any energy stored in the capacitance coupled to the output. As before, this discharge means reduces the magnitude of the winding voltage in the first polarity to less than a predetermined value, preventing sufficient energy from being coupled to switching device 15 and causing device 15 to remain its second conduction state when the converter's operations are terminated. The discharge means also enables the voltage across the transformer windings (e.g., primary winding 122) to reverse to the second polarity in a time interval during the second voltage state of input control signal $V_A$. Rectifier 132 is not strictly needed for the discharge means but may be included in the discharge means to limit the voltage $V_B$ and to recycle stored energy back to the input supply.

By examining graph 382 for voltage $V_B$ shown in FIG. 7, it may be seen that $V_B$ remains positive throughout the switching cycle for the above parameters. As such, rectifier 131 does not conduct and is not needed for circuit 300 with the above parameters and operating conditions. However, the inclusion of rectifier 131 ensures that the voltage across the transformer windings does not exceed $\sim 0.8$ V during the time interval $t_2-t_5$ and after operations terminate, thus ensuring that switching device 15 remains in its second conductive state.

Nonetheless, there are some conditions in which rectifier 131 may be removed from drive circuit 300 so as to reduce the number of components, if need be, without adversely impacting the circuit operation thereof. For example, it can be shown that if the RLC circuit is critically-damped (Q=0.5) or over-damped (Q<0.5) during time interval $t_2$-$t_5$, the voltage $V_B$ will rise to a positive voltage and then decay to zero without becoming negative. This occurs whether or not rectifier 132 is included. For the above magnetizing inductance and capacitance values, this may be accomplished by using a transformer with a sufficient amount of core-loss resistance, or by coupling a resistor in parallel with one of the transformer's windings, the RLC circuit may be made critically-damped or over-damped. For example, a resistance of 577 ohms is needed to critically damp an RLC circuit having and inductance of 100 $\mu$H and a capacitance of 75 pF (less resistance for over-damped). It is possible that a particular transformer may be found which has the desired core less resistance. Alternatively, for a transformer having a 1K-ohm cores loss resistance, a 1.2K ohm resistor may be coupled in parallel with either of transformer's windings. Thus, one embodiment of the discharge means according to the present invention comprises capacitor 134, the above-described coupling of control signal $V_A$ and switch means 110 to transformer 120, and shunting means 150, with the RLC circuit having a Q factor less than or equal to 0.5 during time $t_2$-$t_5$. Neither of rectifiers 131 and 132 would be required by this embodiment.

Under some conditions, the RLC circuit may be under-damped (Q>0.5) such that rectifier 131 again would not be required. This would be the case if, for example, rectifier 132 is included in the discharge means to control the capacitor voltage and (magnetizing) inductor current to well defined values at time $t_3$ and the Q factor is set to a value between zero and one. Rectifier 132 and the core-loss resistance (resistor 125) sufficiently remove and dissipate the stored energy such that voltage $V_B$ does not go negative by more than one threshold voltage of switching device 15. By time $t_3$, rectifier 132 and resistor 125 have removed and dissipated most of the energy, leaving roughly 10.5 mA in inductor 123 and 10.5 V on the capacitance, for a total of 9.6 nJ (5.5 nJ +4.1 nJ). If the RLC circuit is under-damped (Q>0.5) but has a quality factor less than or equal to one (i.e., 0.5<Q<1), the maximum possible negative voltage that can be obtained for $V_B$ is roughly 15% of the voltage across the capacitance at time $t_3$ ($V_{DD}$+0.5), or −1.5 V. This maximum occurs at Q=1. For most switching devices 15, this is sufficiently low to prevent the switching devices from conducting.

This, however, is a conservative calculation and higher Q factors may be tolerated for the following reason. If the voltage $V_B$ tries to go more negative than ∼−0.5 V during time interval $t_3$-$t_5$, the secondary winding voltage tries to go more positive than ∼+0.5 V, causing detection rectifier 151 to begin conducting. The conduction couples the capacitance at port 102 to the resonant RLC circuit. Since this capacitance has been previously discharged to zero volts at time $t_2$ and is generally much larger than the capacitance of transistor 152, it readily absorbs the energy in the RLC circuit and limits voltage $V_B$ to a much lower value, such as for example around −0.8 V. As such, it is possible that larger quality factors, such as up to a value of 2 or 3, without the discharge means requiring rectifier 131.

It may be appreciated that the above drive circuits 100, 200, and 300 may be implemented with complimentary devices for the switch means (110). A fourth embodiment of the present invention wherein the switch means according to the present invention (e.g., switch means 110) comprises a p-type MOSFET device (PMOS) is shown at 400 in FIG. 8. With the exception of switch means 110 and rectifiers 131 and 132, each element of drive circuit 400 is the same as a corresponding element of drive circuit 300. Consequently, the number designation for each of these elements of drive circuit 400 is set to be equal to the number designation of the corresponding element in drive circuit 300. In place of switch means 110 and rectifier 131 and 132, drive circuit 400 comprises switch means 410 and rectifiers 431 and 432, respectively. Switch means 410 comprises a p-type MOSFET device (PMOS) having a control terminal coupled to input port 101, a first conduction terminal coupled to primary winding 122 at the intermediate node where voltage $V_B$ is taken, and a second conduction terminal coupled to the supply $V_{DD}$. Rectifier 431 is coupled in parallel with the conduction terminals such that current may be conducted from the intermediate node to the $V_{DD}$ supply. Rectifier 432 is coupled between the intermediate node and ground (a reference voltage) such that current may be conducted from ground to the intermediate node. Capacitor 134 is also coupled to the intermediate node. The coupling of the remaining components is as described above.

In addition to these differences, drive circuit 400 is driven at port 101 with a complementary signal $V_A'$, which is generated by an inverter 13 from the control signal $V_A$. Accordingly, during the first state of $V_A$, roughly $V_{DD}$ volts are applied to the positive terminal of primary winding 122 and nearly zero volts are applied to the negative terminal thereof. During the second state, nearly $V_{DD}$ volts are applied to the negative terminal of winding 122 and the positive terminal thereof is isolated by switch means 410. Drive circuit 400 operate in an analogous manner as drive circuit 300 to generate the drive signal to switching device 15 while minimizing the energy stored in drive circuit 400 and enabling a clean shut off of device 15 upon termination of operations.

It may be appreciated that switch means 110 (410), rectifiers 131 (431) and 132 (432), capacitor 134, and pulse-width modulation control circuit 12 (and inverter 13 for drive circuit 400) may be integrated together on a single integrated-circuit chip (IC chip) in order to reduce the number of components for drive circuits 100, 200, 300, and 400, thereby reducing manufacturing costs and increase reliability. A fifth embodiment of the present invention shown this integration is shown at 500 in FIG. 9A. Drive circuit 500 is integrated on a semiconductor chip (e.g., silicon) and includes a first terminal 501 for coupling to one terminal of primary winding 122 of transformer 120 (e.g., the positive terminal), a second terminal 502 for coupling to the other terminal of primary winding 122 (e.g., the negative terminal), a ground port 504 for receiving a ground reference voltage, and a supply port 505 for receiving a source of power $V_{DD}$. PWM control circuit 12, switch means 110, rectifiers 131 and 132, and capacitor 134 are coupled to one another as in drive circuit 200. First terminal 501 is coupled to the control signal $V_A$ provided by control circuit 12 and second terminal 502 is coupled to the intermediate node coupling rectifier 132, capacitor 134, and switch means 110, where voltage $V_B$ is taken. Switch means 110 may comprise a MOSFET transistor, a bipolar transistor, or another suitable semiconductor device, whichever may be readily fabricated on the integrated circuit chip.

For completeness, transformer 120 and switching device 15 are also shown in FIG. 9A. Switching device 15 is shown at 520 in FIG. 9A without shunting means 150. Switching device 15 is shown at 530 in FIG. 9B with shunting means 150. Each of resistor 140, transistor 152, and rectifier 151 may be integrated with switching device 15 on a single integrated circuit. This would significantly reduce the volume required for the drive circuits according to the present invention, leaving transformer 120 as the major volume component.

It may be appreciated that PWM control circuit 12 comprises means for generating a control signal having a first voltage state and a second voltage state, as indicated above. Control circuit 12 may generated a fixed duty cycle or may generate a variable duty cycle in response to one or more input signals received from the application environment (e.g., converter). Converter 500 may further include a bus port 503 for receiving these signals.

An exemplary embodiment for control circuit 12 is shown at 600 in FIG. 10. Control circuit 12 is responsive to an enable signal $S_{EN}$ and selectively generates a 50% duty cycle signal for control signal $V_A$ which alternates between a first voltage level of near 9 V and a second voltage level near 0 V. Enable signal $S_{EN}$ is in a logic high state during normal operations and in a logic low state when the operation of switching device 15 is to be terminated. Control circuit 600 includes a 1 Mhz crystal 610, a high value resistor 611 (e.g., 1M ohm), two capacitors 613 and 614 (e.g., ~30 pF each), two CMOS inverters 612 and 615, a D-type flip-flop 620, and an AND gate 630. Each of crystal 610 and resistor 611 is coupled between the input and output terminals of inverter 612 to form a simple crystal oscillator. Also, capacitor 612 is coupled to the input of inverter 612 and capacitor 614 is coupled to the output thereof. The oscillating voltage at the output of inverter 612 is coupled to the input of inverter 615, which provides a oscillating square wave at its output. The output of inverter 615 is coupled to the clock input of flip-flop 620. The Q\ output of flip-flop 620 is coupled to the D input. As is known in the digital circuits art, this causes a square wave to be generated at the Q output which has a frequency half that of the signal at the clock terminal. According, a 500 kHz square wave with a 50% duty cycle is generated at the Q terminal. This is coupled to an input of AND gate 630. The enable signal $S_{EN}$ is coupled to a second input of gate 630, and control signal $V_A$ is coupled from the output of gate 630. When enable signal $S_{EN}$ is logic high, the 50% duty cycle at the Q terminal of flip-flop 620 is coupled to the output, providing control signal VA. When enable signal $S_{EN}$ is logic low, a logic low value is coupled at the output of gate 630 and the control signal $V_A$ caused to remain in its second state, thereby terminating the operation of switching device 15. In general, all of the components of control means 600 except crystal 610 may be integrated on the semiconductor IC chip.

It may be appreciated that other control circuits may be used. Indeed, the type of control circuitry generally depends upon the application environment. Currently, the present invention has been applied to several type of power converters using the current mode control method. For these applications, the ASTEC AS3842/3/4/5 family of current mode PWM control chips manufactured by Astec Semiconductor have been used for control circuit 12.

While the present invention has been particularly described with respect to the illustrated embodiment, it will be appreciated that various alterations, modifications and adaptations may be made based on the present disclosure, and are intended to be within the scope of the present invention. While the invention has been described in connection with what is presently considered to be the most practical and preferred embodiment(s), it is to be understood that the present invention is not limited to the disclosed embodiment(s) but, on the contrary, is intended to cover various modifications and equivalent arrangements included within the scope of the appended claims.

What is claimed is:

1. A drive circuit for controlling the operation of a switching device, the switching device including a control port for receiving a signal from said drive circuit for controlling its conductance state, said drive circuit being responsive to an input control signal having a first state for directing the switching device to enter a first conduction state and a second state for directing the switching device to enter a second conduction state, the input control signal alternating between its first and second states during normal operation and being caused to remain in its second state when operation of the switching device is to be terminated, said drive circuit comprising:

an output port for coupling to the control port of the switching device;

a transformer having a primary winding and a secondary winding, said secondary winding being coupled to said output port, said primary winding having a first terminal and a second terminal;

coupling means responsive to said input control signal for coupling power to said primary winding when the input control signal is in its first state, said coupling causing a voltage of a first polarity to be applied across said primary winding, a portion of said power being coupled to the control port of the switching device by said secondary winding and causing the switching device to enter its first conduction state, said transformer storing energy in response to the coupling of said power, said coupling means further for uncoupling said power from said primary winding and substantially removing said power from said primary winding when the input control signal enters its respective second state, said portion of said power thereafter being uncoupled from the switching device such that said switching device is caused to enter its second conduction state; and discharge means coupled to said transformer and responsive to the uncoupling of said power from said primary winding for discharging the energy stored in said transformer during the second state of said control signal such that sufficient power is prevented from being coupled to the switching device to cause it to enter its first conduction state during the time the input control signal is in its second state, said discharge means comprising a reversal means for applying a voltage having a second polarity opposite to said first polarity across said primary winding in a time interval during the second state of said input control signal, said second polarity voltage discharging the energy stored in said transformer, said reversal means comprising a means for applying a first reference voltage to the first terminal of said primary winding and a first capacitance coupled to said second terminal of said primary winding, the energy stored in said transformer being directed into said first capacitance during said second state of said input control signal such that a reversing voltage is generated thereon and a voltage of said second polarity is applied to said primary winding, said discharge means further comprising a second reference voltage and a rectifier coupled between the second terminal of said primary winding and said second reference voltage, said rectifier conducting current to limit the magnitude of voltage across said primary winding having said second polarity to less than a predetermined value during the time said input control signal is in its second state.

2. The drive circuit of claim 1 wherein said switching device has a capacitance at its control port, said switching device capacitance storing energy when power is coupled to said primary winding by said coupling means, wherein said discharge means further comprises a forcing means for initially forcing the voltage across said primary winding to substantially zero volts when said input control signal enters its second state, said forcing means initiating the discharge of the energy stored by the switching device capacitance, and wherein said discharge means is further for discharging during the second state of said control signal the energy stored by the switching device capacitance such that sufficient power is prevented from being coupled to the switching device to cause it to enter its first conduction state during the time the input control signal is in its second state.

3. The drive circuit of claim 1 wherein the first state of the input control signal includes a first voltage, wherein the first terminal of said primary winding is coupled to the input control signal, and wherein said coupling means comprises a switch means responsive to the input control signal and coupled between the second terminal of said primary winding and a reference voltage, the difference between said first voltage and said reference voltage providing said power to said primary winding, said switch means closing in response to the input control signal entering its first state and opening in response to the input control signal entering its second state, said switch means when closed causing said reference voltage to be applied to said primary winding.

4. The drive circuit of claim 3 wherein the switch means of said coupling means comprises a MOSFET transistor.

5. The drive circuit of claim 3 wherein the second state of the input control signal comprises a second voltage substantially equal to said reference voltage, and wherein said first capacitance is charged to a voltage substantially equal to said reference voltage prior to when said switch means opens, said first capacitance and the input control signal each initially applying a voltage substantially equal to the reference voltage to each of the primary winding terminals when the input control signal enters its second state.

6. The drive circuit of claim 1 wherein said transformer further includes an amount of magnetizing inductance L and an amount of core losses having an effective resistance value R; and wherein said magnetizing inductance L, said effective core loss resistance R, said first capacitance, and the switching device capacitance form a damped resonant parallel RLC circuit during the second state of the input control signal, said first capacitance and said switching device capacitance combining to form an equivalent capacitance C during said second state, said damped resonant RLC circuit having a Q factor of less than approximately 0.5 during said second state, said Q factor being defined as:

$$Q = R\sqrt{C/L}.$$

7. The drive circuit of claim 1 wherein said transformer further includes an amount of magnetizing inductance L and an amount of core losses having an effective resistance value R;

wherein said magnetizing inductance L, said effective core loss resistance R, said first capacitance, and the switching device capacitance form a damped resonant parallel RLC circuit during the second state of the input control signal, said first capacitance and said switching device capacitance combining to form an equivalent capacitance C during said second state, said damped resonant RLC circuit having a Q factor of less than approximately 1 during said second state, said Q factor being defined as:

$$Q = R\sqrt{C/L}.$$

8. The drive circuit of claim 3 wherein a discharge current is reflected from said secondary winding to said primary winding when the energy from the switching device capacitance is discharged, and wherein said discharge means further comprises a first rectifier coupled between said second terminal of said primary winding and said first reference voltage, said first rectifier oriented to conduct said discharge current when said input control signal enters its second state.

9. The drive circuit of claim 3 wherein said discharge means comprises a predetermined amount of magnetizing inductance L in said transformer and corresponding amount of magnetizing current $I_M$, wherein a discharge current is coupled from said output port to the secondary winding of the transformer when the energy from the switching device capacitance is discharged, and wherein the magnetizing current $I_M$ substantially supports said discharge current such that said discharge current is not substantially coupled to the primary winding of said transformer.

10. A drive circuit for controlling the operation of a switching device, the switching device including a control port for receiving a signal from said drive circuit for controlling its conductance state, said drive circuit being responsive to au input control signal having a first state for directing the switching device to enter a first conduction state and a second state for directing the switching device to enter a second conduction state, the input control signal alternating between its first and second states during normal operation and being caused to remain in its second state when operation of the switching device is to be terminated, said drive circuit comprising:

an output port for coupling to the control port of the switching device, said output port including first and second terminals;

a transformer having a primary winding and a secondary winding, said secondary winding being coupled to said output port;

coupling means responsive to said input control signal for coupling power to said primary winding when the input control signal is in its first state, a portion of said power being coupled to the control port of the switching device by said secondary winding and causing the switching device to enter its first conduction state, said transformer storing energy in response to the coupling of said power, said coupling means further for uncoupling said power from said primary winding and substantially removing said power from said primary winding when the input control signal enters its respective second state, said portion of said power thereafter being uncoupled from the switching device such that said switching device is caused to enter its second conduction state; and discharge means coupled to said transformer and responsive to the uncoupling of said power from said primary winding for discharging the energy stored in said transformer during the second state of said control signal such that sufficient power is prevented from being coupled to the switching device to Cause it to enter its first conduction state during the time the input control signal is in its second state, said discharge means comprising a shunting means coupled between the secondary winding of said transformer and the terminals of said output port for shunting said output terminals to one another when said input control signal enters it said second state.

11. The drive circuit of claim 10 wherein said shunting means comprises a detection means for detecting when said input control signal enters its said second state and for generating a shunt signal in response thereto, and a transistor having a control terminal responsive to said shunt signal and two conduction terminals, each said conduction terminal coupled to a respective terminal of said output port, said transistor conducting in response to said shunt signal.

12. The drive circuit of claim 11 wherein said detection means comprises a detection rectifier coupled between said secondary winding and one of said terminals of said output port, said detection rectifier oriented such that it may conduct current when said input control signal is in its first state and such that it substantially blocks current when said input control signal is in its second state, said detection rectifier generating said shunt signal as a voltage when said detection rectifier is substantially blocking current.

13. The drive circuit of claim 10 wherein the coupling of said power to said primary winding causes a voltage of a first polarity to be applied across said primary winding and wherein said discharge means comprises a reversal means for applying a voltage having a second polarity opposite to said first polarity across said primary winding in a time interval during the second state of the input control signal, said second polarity voltage discharging the energy stored in said transformer.

14. The drive circuit of claim 13 wherein said primary winding has a first terminal and a second terminal, and wherein said reversal means comprises a means for applying a first reference voltage to the first terminal of said primary winding and a first capacitance coupled to said second terminal of said primary winding, the energy stored in said transformer being directed into said first capacitance during said second state of said input control signal such that a reversing voltage is generated thereon and a voltage of said second polarity is applied to said primary winding.

15. The drive circuit of claim 14 wherein said transformer further includes an amount of magnetizing inductance L and an amount of core losses having an effective resistance value R;

wherein said magnetizing inductance L, said effective core loss resistance R, said first capacitance, and the switching device capacitance form a damped resonant parallel RLC circuit during the second state of the input control signal, said first capacitance and said switching device capacitance combining to form an equivalent capacitance C during said second state, said damped resonant RLC circuit having a Q factor of less than approximately 0.5 during said second state, said Q factor being defined as:

$$Q = R\sqrt{C/L}.$$

16. The drive circuit of claim 14 wherein said discharge means further comprises a second reference voltage, and a rectifier coupled between said second terminal of said primary winding and said second reference voltage, said rectifier conducting current to limit the magnitude of voltage across said primary winding having said second polarity to less than a predetermined value during the time the input control signal is in its second state.

17. The drive circuit of claim 16 wherein said transformer further includes an amount of magnetizing inductance L and an amount of core losses having an effective resistance value R;

wherein said magnetizing inductance L, said effective core loss resistance R, said first capacitance, and the switching device capacitance form a damped resonant parallel RLC circuit during the second state of the input control signal, said first capacitance and said switching device capacitance combining to form an equivalent capacitance C during said second state, said damped resonant RLC circuit having a Q factor of less than approximately 1 during said second state, said Q factor being defined as:

$$Q = R\sqrt{C/L}.$$

18. A drive circuit integrated on a semiconductor chip for controlling the operation of a switching device, the switching device being isolated by a transformer having a first winding and a second winding, the second winding being coupled to the switching device, said drive circuit comprising:

an output port for coupling to the transformer's first winding and including a first output terminal and a second output terminal;

means for generating a control signal having a first voltage state and a second voltage state, said control signal being coupled to said first output terminal;

a transistor having a control terminal coupled to said control signal, a first conduction terminal coupled to a first reference voltage, and a second conduction terminal coupled to said second output terminal, said transistor being rendered conductive in response to said control signal entering its first voltage state and rendered non-conductive in response to said control signal entering its second voltage state, said transistor when closed causing a voltage having a first polarity to be applied across said first and second output terminals; and a first rectifier coupled between said second output terminal and said first reference voltage, said first rectifier oriented such that it may conduct current when a voltage of said first polarity is applied across said output terminals during the time said control signal is in its second voltage state, said first rectifier coupling said first reference voltage to said second output terminal when it is conducting, said second voltage state of said control signal and said first reference voltage having values such that said first rectifier when conducting current limits the magnitude of voltage across said output terminals having said first polarity to less than a first predetermined value during the time said control signal is in its second voltage state.

19. The drive circuit of claim 18 wherein said second voltage state of said control signal is substantially equal in value to said first reference voltage.

20. The drive circuit of claim 18 further comprising a second reference voltage, and a second rectifier coupled between said second reference voltage and the second terminal of said output port, said second rectifier oriented such that it may conduct when a voltage having a second polarity opposite to said first polarity is applied across said output terminals during the time said control signal is in its second voltage state, said second rectifier limiting the magnitude of the voltage across said output terminals having said second polarity during the time said control signal is in its second voltage state to a second predetermined value by conducting current to said second reference voltage.

* * * * *